United States Patent
Taguwa

(10) Patent No.: US 6,204,170 B1
(45) Date of Patent: Mar. 20, 2001

(54) METHOD FOR MANUFACTURING SEMICONDUCTOR DEVICE HAVING METAL SILICIDE FILM AND METAL FILM IN WHICH METAL FILM CAN BE SELECTIVELY REMOVED

(75) Inventor: Tetsuya Taguwa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/072,668

(22) Filed: May 6, 1998

(30) Foreign Application Priority Data

May 8, 1997 (JP) .................................... 9-118461

(51) Int. Cl.$^7$ ................................................ H01L 21/4763
(52) U.S. Cl. ........................ 438/649; 438/664; 438/674; 438/683; 438/720
(58) Field of Search .................... 438/649, 655, 438/664, 669, 674, 660, 683, 720

(56) References Cited

U.S. PATENT DOCUMENTS

| | | | |
|---|---|---|---|
| 4,619,038 | * | 10/1986 | Pintchovski ............................. 29/590 |
| 4,957,590 | * | 9/1990 | Douglas ................................ 156/643 |
| 5,143,866 | * | 9/1992 | Matsutani ............................. 438/696 |
| 5,397,744 | * | 3/1995 | Sumi et al. ........................... 438/643 |
| 5,652,180 | * | 7/1997 | Shinriki et al. ...................... 438/190 |
| 5,716,870 | * | 2/1998 | Foster et al. ......................... 438/675 |
| 5,721,021 | * | 2/1998 | Tobe et al. ........................... 427/570 |
| 5,744,395 | * | 4/1998 | Shue et al. ........................... 438/305 |
| 5,856,237 | * | 1/1999 | Ku ........................................ 438/683 |
| 5,880,526 | * | 3/1999 | Hatano et al. ........................ 257/763 |
| 5,926,737 | * | 7/1999 | Ameen et al. ....................... 438/649 |
| 5,950,083 | * | 9/1999 | Inoue et al. .......................... 438/233 |
| 5,972,790 | * | 10/1999 | Arena et al. ......................... 438/649 |

FOREIGN PATENT DOCUMENTS

| | | |
|---|---|---|
| 2-241033 | 9/1990 | (JP) . |
| 3-93223 | 4/1991 | (JP) . |
| 5-211134 | 8/1993 | (JP) . |
| 5-259110 | 10/1993 | (JP) . |
| 7-99174 | 4/1995 | (JP) . |
| 9-63988 | 3/1997 | (JP) . |

* cited by examiner

Primary Examiner—George Fourson
Assistant Examiner—Kurt Eaton
(74) Attorney, Agent, or Firm—Sughrue, Mion, Zinn, Macpeak & Seas, PLLC

(57) ABSTRACT

In order to prevent a thick metal nitride film formed in a contact hole or a through-hole and on an insulating film to bury the hole from being cracked of peeled off, a method for easily removing unnecessary metal film on the insulating film while leaving a metal silicide film formed in the hole is provided. The method comprises the steps of depositing a titanium film in the hole formed in the insulating film and on the insulating film by CVD, forming the metal silicide film by a reaction between the titanium film on a bottom of the hole and a semiconductor substrate and, then, selectively removing unnecessary metal film other than the metal silicide film by using an etching gas containing halogen.

4 Claims, 6 Drawing Sheets

METHOD FOR MANUFACTURING SEMICONDUCTOR DEVICE HAVING METAL SILICIDE FILM AND METAL FILM IN WHICH METAL FILM CAN BE SELECTIVELY REMOVED

BACKGROUND OF THE INVENTION

1. Field of the Invention

The present invention relates to a manufacturing method of a semiconductor device and, particularly, to a manufacturing method of a semiconductor device having a metal silicide film.

2. Description of the Related Art

With the increase of integration density of LSI, the fineness of a contact hole thereof is having been increased and the aspect ratio of contact hole, which is represented by a depth of the contact hole divided by a diameter thereof, is also having been increased. When a conventional metal film of such as aluminum formed by sputtering is used in a semiconductor, it is difficult to obtain an acceptable step coverage. Therefore, the connection resistance becomes high and there is a possibility of breakage of a wiring. Even if a formation of wiring is not impossible, the problem of tendency of breakage of wiring is left as it is due to electro-migration of aluminum caused by electric current flowing therethrough. In order to solve this problem, the tungsten plug method in which contact holes are buried with a tungsten film formed by chemical vapor deposition and can provide a superior step coverage has been proposed. According to the tungsten plug method, a tungsten plug is formed, after a barrier metal formed of titanium for lowering a connection resistance (contact resistance) of a contact hole and titanium nitride for improving the intimate adhesion between titanium and tungsten and preventing immigration of tungsten into a semiconductor substrate is formed by sputtering, forming a tungsten film by chemical vapor deposition to bury the contact hole with tungsten and etching back the tungsten film while leaving tungsten in only the contact hole.

According to this method, however, when the contact hole becomes finer and the aspect ratio thereof becomes larger, it becomes impossible to form a titanium film or a titanium nitride film to a desired thickness in the contact hole by sputtering. Therefore, the contact resistance becomes larger and a semiconductor element is damaged by tungsten.

In order to solve these problems, it has been tried to form a titanium film and a titanium nitride film by chemical vapor deposition (CVD) providing a better step coverage. Particularly, the step coverage of titanium nitride film is superior when it is formed by CVD utilizing thermal reaction and is used popularly. It is usual to bury a contact hole by forming a 3-metal layer including a titanium layer, a titanium nitride film and a tungsten film by CVD. In such method, however, the manufacturing step becomes complicated and a manufacturing cost is increased. In order to solve this problem, it has been proposed to bury the contact hole with only the titanium film and the titanium nitride film by removing the step of forming the tungsten film.

FIGS. 4(a) to 4(d) are cross sections of a semiconductor wafer, showing the above mentioned conventional manufacturing steps of burying a contact hole. First, on a silicon substrate 301 in which an element is formed, a BPSG film 302 in the form of a silicon oxide film containing phosphor or boron is formed as an inter-layer insulating film by CVD. Thereafter, a contact hole is formed up to a surface of the element by using a usual photolithography and dry-etching technique (FIG. 4(a)). A diameter of the contact hole may be about 0.4 $\mu$m.

Then, the contact hole is completely buried by forming a titanium film 303 to a thickness of 10~50 nm by plasma CVD and a titanium nitride film 305 to a thickness of 0.3 $\mu$m by usual thermal CVD (FIG. 4(b)). The titanium film 303 reacts with the silicon substrate and a titanium silicide film 304 is formed by heating the semiconductor substrate to a temperature of 500° C. or higher.

Thereafter, the titanium film 303 and the titanium nitride film 305 on the BPSG film 302 are removed by dry-etching using chloride gas while leaving portions of the titanium silicide film 304 and the titanium nitride film 305 in only the contact hole (FIG. 4(c)).

Then, an aluminum alloy film 306 is deposited on the BPSG film 302 by sputtering and patterned to a desired shape by using photolithography and dry-etching technique, resulting in an aluminum wiring (FIG. 4(d)).

In the conventional manufacturing method of semiconductor device mentioned above, however, a large tensile stress of 8E10 dyne/cm$^2$ or more is exerted on the titanium nitride film formed by CVD and burying the contact hole, when the titanium nitride film is thick. Further, the adhesion of the titanium film to the titanium nitride film formed by thermal CVD is not favorable. For these reasons, the titanium nitride film may be cracked or peeled off from the titanium film. When the titanium nitride film is peeled off from the titanium film, the underlying inter-layer insulating film (BPSG film) may be abnormally etched in the subsequent etching step of the titanium nitride film, so that the manufacturing yield is lowered and the reliability of a resultant semiconductor device is lowered. Further, the peeled titanium nitride film portion becomes immigrant which is also a cause of degradation of yield. When the titanium nitride film is cracked, the abnormal etching of the underlying layer may occur.

In order to solve the above problem, in lieu of the formation of the titanium nitride film 305 by depositing it on the titanium film 303 as shown in FIG. 4(b), it may be considered that, after the titanium film 303 and hence the titanium silicide film 304 are formed, the titanium film 303 is etched away such that only the titanium silicide film 304 is left and, thereafter, the titanium nitride film 305 is deposited.

The conventional method for selectively removing only the titanium film 303 by etching uses a mixture of aqueous ammonia and aqueous hydrogen peroxide. The selective etching step takes a substantial time since it requires, in addition to several minutes for selective removing, a washing time (about 10 minutes) after the etching step, a drying time (about 5 minutes) by a spin dryer, etc. Further, it is clear that there is a problem of a large amount of waste liquid.

SUMMARY OF THE INVENTION

Therefore, an object of the present invention is to provide a method of fabricating a semiconductor device, according to which a titanium film can be etched while leaving a titanium silicide film.

According to the present invention, a method of fabricating a semiconductor device having a metal silicide film and a metal film is featured by selectively removing the metal film by an etching gas containing halogen.

Further, another method of fabricating a semiconductor device is featured by comprising the steps of forming a metal film and a metal silicide film by chemical vapor deposition and selectively removing the metal film by using a gas containing halogen as in the case of chemical vapor deposition method.

According to the present method, it is possible to selectively remove the metal film in a state not wet but dry.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

FIGS. 1(a) to 1(g) are cross sections of a semiconductor wafer showing main steps of a manufacturing method according to a first embodiment of the present invention, respectively.

Figure 1A:
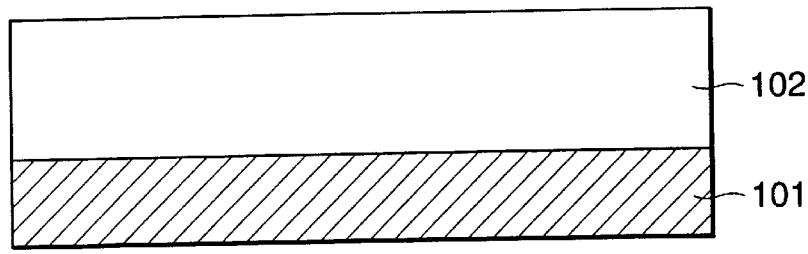
FIGS. 1(a) to 1(g) are cross sections of a semiconductor wafer showing main manufacturing steps according to a first embodiment of the present invention, respectively.
Figure 1B:
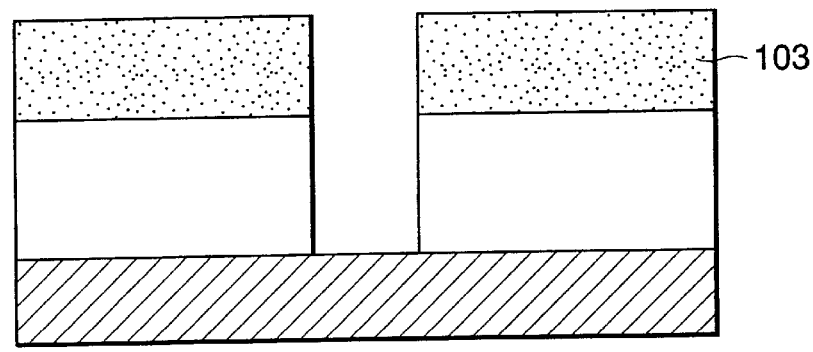

A BPSG film 102 is formed as an inter-layer insulating film about 1.5 μm on a silicon substrate 101 in which elements (not shown) are formed, by CVD (FIG. 1(a)). Thereafter, a photo resist film 103 is formed by painting, an opening having a diameter of about 0.3 μm is formed in a desired position of the photo resist film through an exposure step and a development step and the BPSG film 102 is dry-etched up to the silicon substrate by using a mixture gas of trifluoromethane ($CHF_3$) gas and carbon monoxide (CO) gas with using the photo resist film 103 as a mask to form a contact hole (FIG. 1(b)).

Figure 1C:
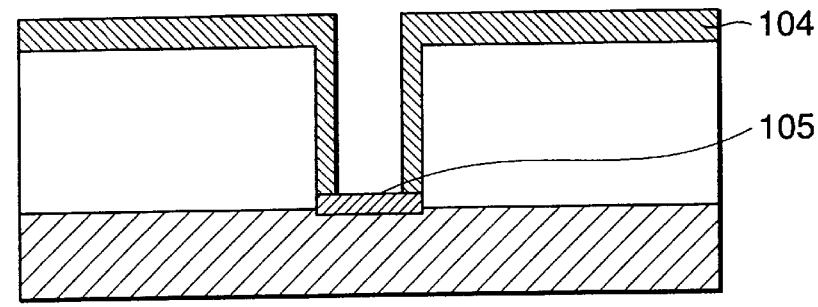

Then, the photo resist film 103 is removed and, thereafter, a titanium film 104 is formed by CVD (FIG. 1(c)). The titanium film 104 has a thickness of 10~30 nm and formed by flowing titanium tetrachloride gas, argon (Ar) gas and hydrogen ($H_2$) gas at flow rates 3~10 sccm, 200~500 sccm and 1000~2000 sccm, respectively, heating the silicon substrate 101 to 500~600° C. under pressure of 3~10 Torr and applying an RF power of several hundreds W between opposite electrodes of the substrate to generate plasma. Under these conditions, the titanium film 104 formed on the silicon substrate is immediately silicided to form a titanium silicide film 105 having a C49 type structure while the titanium film 104 formed on the inter-layer insulating film (oxide film) such as BPSG film is not silicided.

Figure 1D:
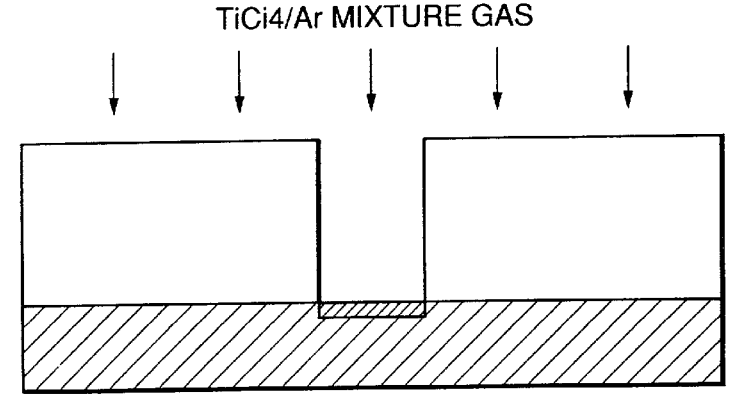

Then, as shown in FIG. 1(d), the substrate is selectively etched by flowing a mixture gas of titanium tetrachloride and argon while maintaining the temperature of the substrate at 500° C. to remove other titanium film than the titanium silicide film 105.

The latter etching step can be performed under the same conditions as those used in the formation of the titanium film, except the RF power which is 0 W, that is, plasma is not generated. Since the gases other than titanium tetrachloride are mixed in order to dilute the titanium tetrachloride gas, these gases may be any provided that they can achieve the purpose of dilution of titanium tetrachloride gas.

Therefore, although hydrogen gas is not used in this embodiment, it is possible to use hydrogen gas in the mixture gas. In such case, since RF power is 0 W and there is no hydrogen radicals generated, a deposition of titanium film may not occur. In order to further prevent titanium film from being deposited, hydrogen is not used in this embodiment. Although the formation step of the titanium film by CVD and the removal of unnecessary portion of the titanium film are described as separate steps for convenience of description, it is possible practically to perform these steps continuously with higher efficiency.

Figure 2:
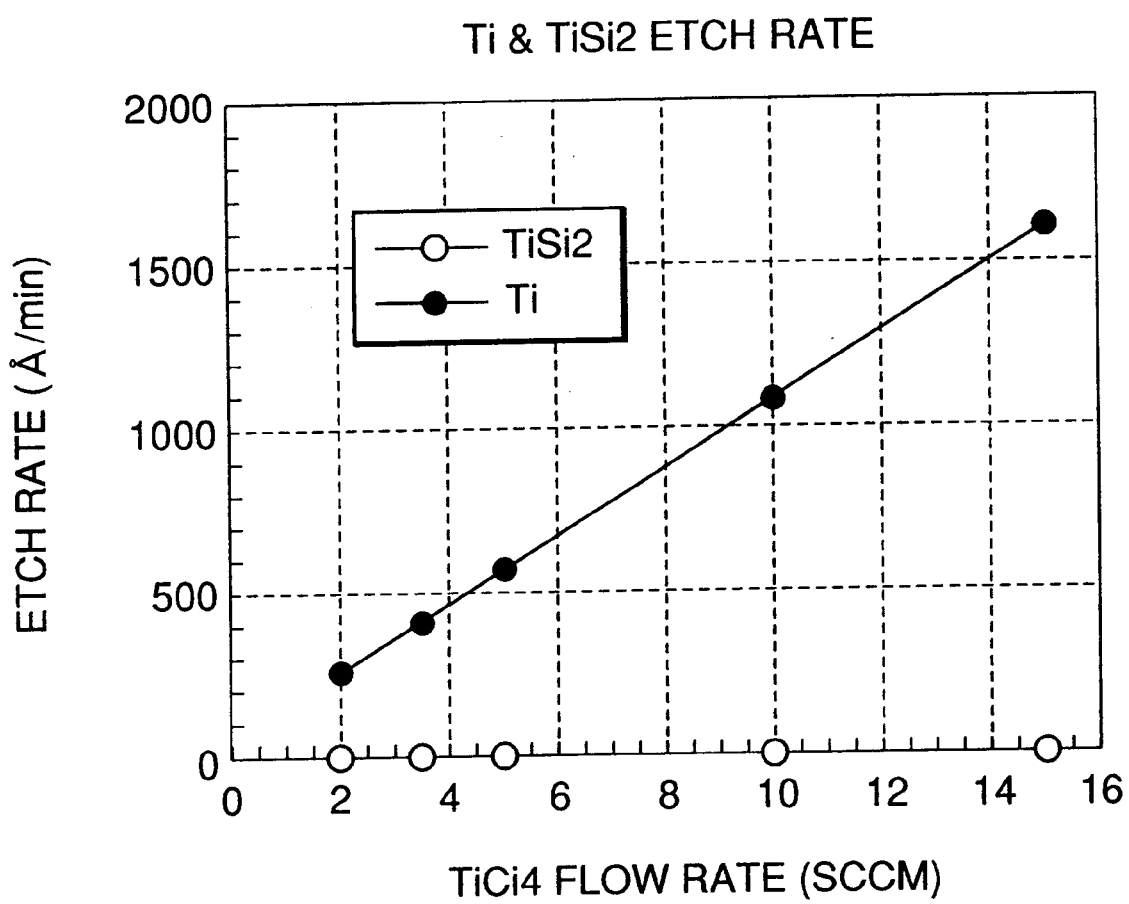
FIG. 2 is a graph showing an etching speed of a titanium substrate and a titanium silicide substrate by titanium tetrachloride, according to the present invention.

FIG. 2 is a graph showing the dependency of the etching rates of the titanium substrate and the titanium silicide substrate by using titanium tetrachloride on a flow rate of titanium tetrachloride. For the case of the titanium substrate, the etching rate by using titanium tetrachloride is generally large and increased with increase of the flow rate of titanium tetrachloride. On the other hand, for the case of the titanium silicide substrate, it is substantially not etched by titanium tetrachloride and, therefore, the etching rate thereof has no dependency on the flow rate of titanium chloride. As such, titanium tetrachloride has a high selectivity in etching between the titanium substrate and the titanium silicide substrate.

Figure 1E:
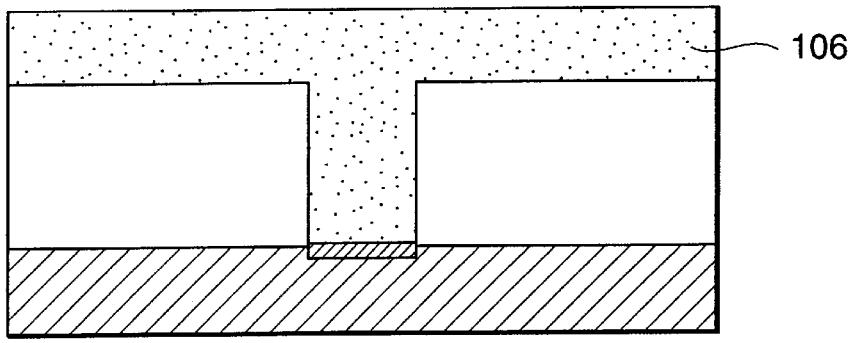

Then, as shown in FIG. 1(e), a titanium nitride film 106 is formed to a thickness of 0.2~0.3 μm by thermal CVD by flowing titanium tetrachloride, ammonia ($NH_3$) and nitrogen gas ($N_2$) at rates 30~50 sccm, 40~70 sccm and 30~50 sccm, respectively, under pressure of 15~30 Torr while heating the semiconductor substrate to 400~650° C. to bury the contact hole.

Figure 1F:
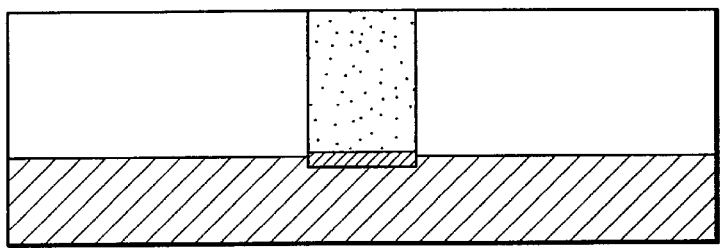

The titanium nitride film 106 on the flat portion of the wafer is removed by etching the whole surface thereof by chlorine gas to expose the surface of the BPSG film 102, while leaving the titanium nitride film 106 in only the contact hole (FIG. 1(f)).

Figure 1G:
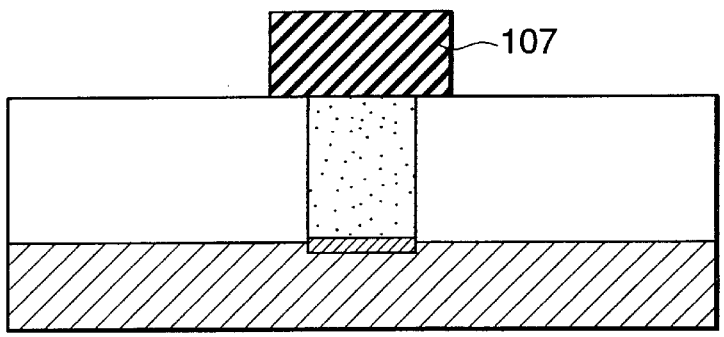

Then, an aluminum alloy film 107 is formed to a thickness of 0.3~1.0 μm by sputtering, patterned to a desired shape by the usual photolithography and dry-etching techniques, resulting in an aluminum wiring (FIG. 1(g)).

A working example and effect of this embodiment will be described.

According to the manufacturing method of the present invention, among the titanium film and the titanium silicide film (on the silicon substrate) both formed by CVD, only the titanium film is selectively removed by the mixture gas of titanium tetrachloride and the diluting gas. The adhesion between the titanium nitride and the oxide film is superior. Therefore, even if the vapor phase epitaxy titanium nitride film is thick, there is no case where the titanium nitride film is cracked or peeled off from the oxide film.

Further, the step coverage of the titanium film formed by CVD is high, it is possible to form, on a bottom of the contact hole, the titanium film which is thick enough to reduce the contact resistance.

Further, the step of removing the titanium film, which is a cause of the peel-off of the titanium nitride film, can be performed by CVD with using titanium tetrachloride as the process gas. Therefore, the titanium film removing step can be performed subsequent to the CVD process continuously, resulting in an improvement of efficiency. Although, in this embodiment, the etching of the unnecessary titanium film is performed immediately after the formation the titanium film, the same effect can be obtained by shifting the semiconductor substrate to another reaction chamber such as a reaction chamber for forming the titanium nitride film and the removing step is performed immediately before the formation of the titanium nitride film.

Further, in this embodiment, the contact hole is buried by the titanium silicide film 105 and the titanium nitride film 106 formed by CVD, so that it is possible to bury the contact hole having a large aspect ratio and to easily form a wiring capable of providing a low contact resistance with respect to the silicon substrate on the bottom of the contact hole.

As the etching gas other than titanium tetrachloride, a halogen gas such as titanium trichloride, titanium dichloride or titanium monochloride, etc., can be used.

FIGS. 3(a) to 3(f) are cross sections of a semiconductor wafer showing main steps of a semiconductor manufacturing method according to a second embodiment of the present invention. This embodiment shows a case where the present invention when applied to a salicide process.

Figure 3A:
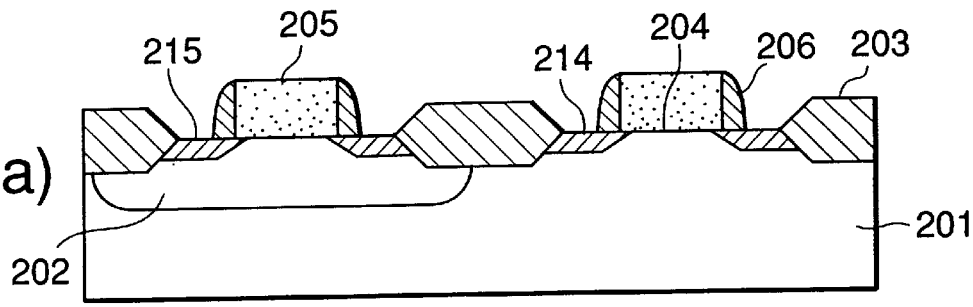
FIGS. 3(a) to 3(f) are cross sections of a semiconductor wafer showing main manufacturing steps according to a second embodiment of the present invention, respectively.

As shown in FIG. 3(a), an N well 202 is formed in an area of a P type silicon substrate 201, in which a P channel insulating film gate transistor is formed, by ion-implantation. Then, a field insulating oxide film 203 having a thickness of 300 nm is formed on a surface of the silicon substrate by selective oxidation. A gate oxide film 204 having a thickness of 6 nm is formed in an active region surrounded by the field insulating oxide film 203 as a gate insulating film and, then, a polysilicon having a thickness of 150 nm is grown as a gate electrode material. Then, the polysilicon is patterned by the known photolithography and dry-etching methods, resulting in a gate electrode 205. Thereafter, an N type impurity diffusion layer 215 of low impurity density and a P type impurity diffusion layer 214 of low impurity density are formed by using the photolithography and the ion-implantation method. Further, a silicon oxide film 70 nm thick is grown on the whole surface of the wafer and a sidewall 206 is formed on a side face of the gate electrode 205 by etching back the silicon oxide film.

Figure 3B:
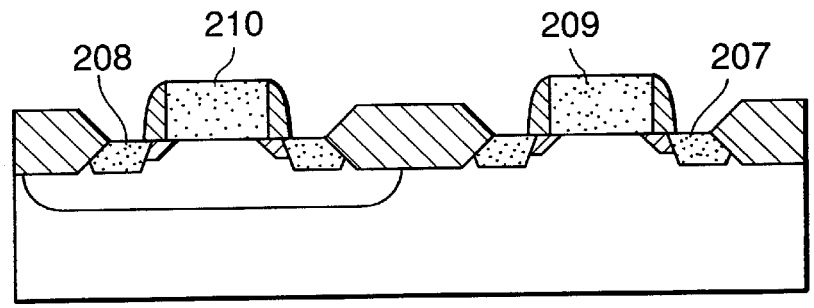

Then, as shown in FIG. 3(b), an N type impurity diffusion layer 207, a P type impurity diffusion layer 208, an N type polysilicon gate 209 and a P type polysilicon gate 210 are formed by using the photolithography and the ion-implantation. After the ion-implantation, the recovery of silicon crystal and the activation of impurity are performed by a heat treatment at 900° C. for 20 minutes in nitrogen atmosphere. Thus, an N type source drain region 207 and a P type source drain region 208 are formed as having LDD structure.

Figure 3C:
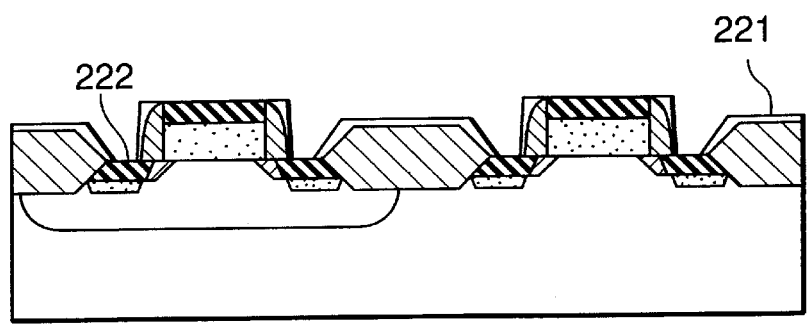

Then, as shown in FIG. 3(c), natural oxide films on a surface of the polysilicon which is the gate electrode and on the surface of the semiconductor substrate are removed by diluted hydrofluoric acid and a titanium film 20 nm thick is deposited on the semiconductor substrate by CVD. The titanium film is formed by thermal CVD by flowing titanium tetrachloride ($TiCl_4$), argon (Ar) and hydrogen gas ($H_2$) at rates 3~15 sccm, 200~500 sccm and 1000~2000 sccm, respectively, under pressure of 3~10 Torr, while heating the semiconductor substrate to 500~600° C. and applying an RF power of several hundreds W between the opposite electrodes of the substrate. Under these conditions, the titanium film on the silicon substrate and the polysilicon gate is silicided to a titanium silicide film 222 having C 49 type structure and that on the inter-layer insulating film (oxide film) is not silicided and becomes a titanium film 221.

Figure 3D:
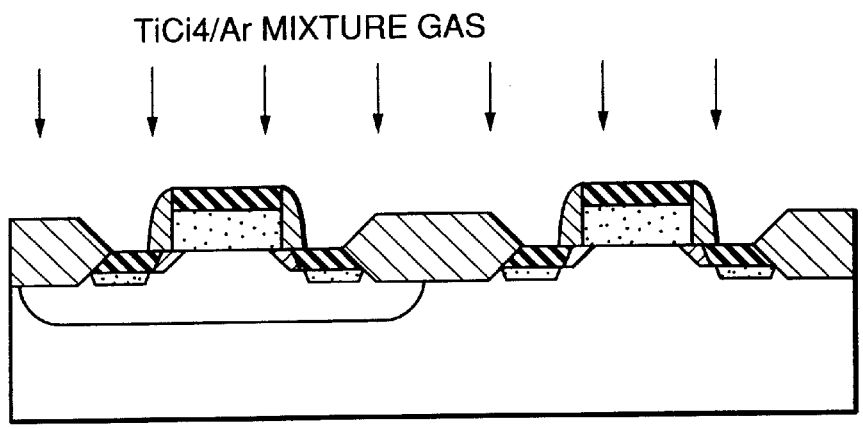

Then, as shown in FIG. 3(d), the unnecessary titanium film 221 other than the titanium silicide film 222 is removed by selectively etching it by using a mixture gas of titanium tetrachloride and argon.

Conditions of the last etching are substantially the same as those used in the formation of the titanium film except that the RF power in the last etching is 0 W. However, since other gases than titanium tetrachloride are added to dilute titanium tetrachloride, they may be any provided that they are effective to achieve the purpose.

Figure 3E:
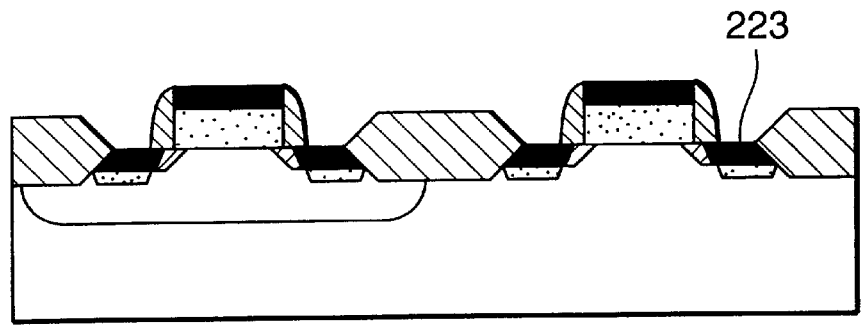

Then, as shown in FIG. 3(e), the titanium silicide 222 having C49 type structure is converted into a titanium silicide 223 having C54 type structure whose electric resistivity is lower than that of the titanium silicide 222, by performing RTA at 800° C. or higher.

Figure 3F:
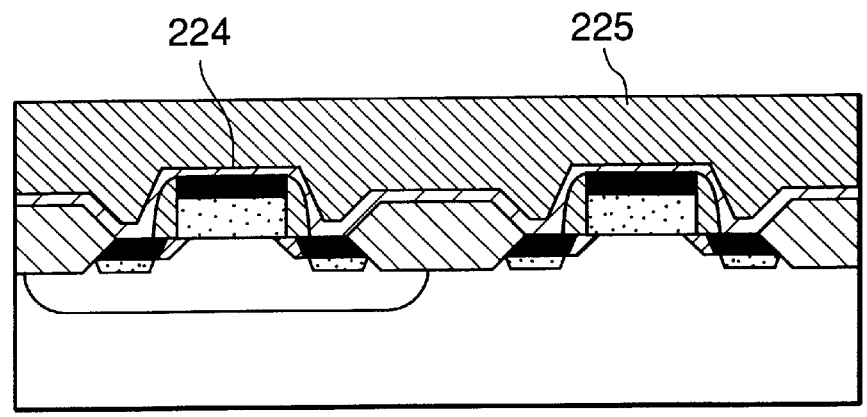
Figure 4A:
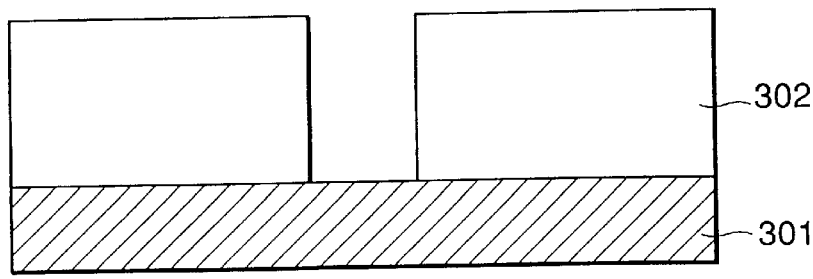
FIGS. 4(a) to 4(d) are cross sections of a semiconductor wafer showing a conventional manufacturing steps of a semiconductor device, respectively.
Figure 4B:
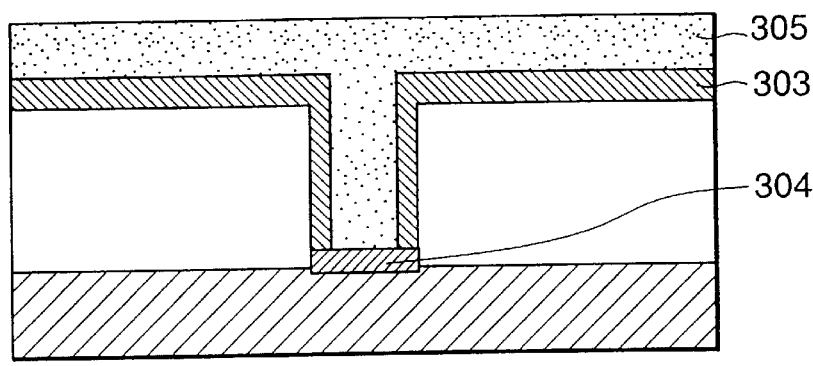
Figure 4C:
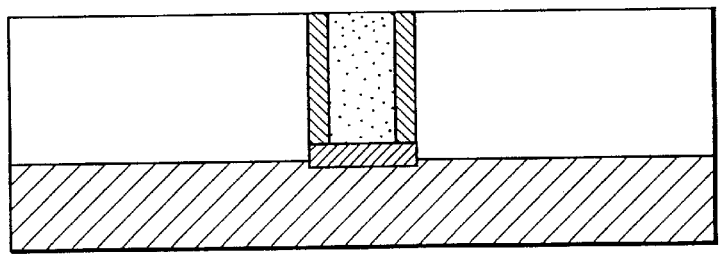
Figure 4D:
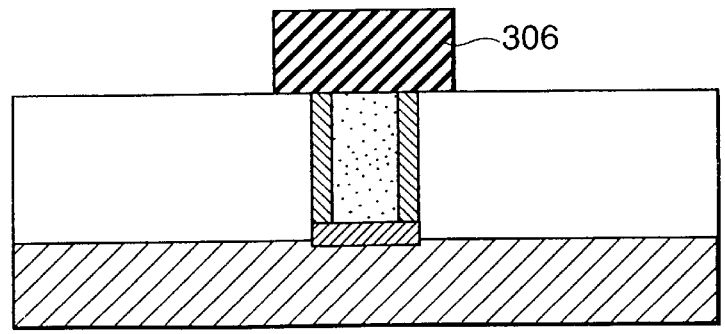

Then, as shown in FIG. 3(f), a silicon oxide film 224 containing no impurity is deposited as an inter-layer insulating film and, subsequently thereto, a silicon oxide film 225 containing impurity such as boron or phosphor is deposited. The inter-layer insulating film is baked by a furnace anneal at about 800° C.

A working example and effect of this embodiment will be described.

According to the manufacturing method of the present invention, titanium silicide film having the C49 type structure is immediately formed on the silicon substrate by reducing titanium tetrachloride by the titanium CVD at the substrate temperature of 500° C. or higher. On the other hand, on the oxide film, the titanium film is formed. Since titanium tetrachloride has a high selective etching characteristics for the titanium film and the titanium silicide film as shown in FIG. 2 and is a gas used in the CVD process, it makes possible to remove the titanium film continuously during the CVD process then and there. Therefore, it is possible to substantially reduce the number of process steps compared with the conventional method and it is possible to provide high producibility.

As described hereinbefore, the manufacturing method of semiconductor device according to the present invention comprises the steps of depositing titanium by CVD at 500° C. or higher, making the titanium on the silicon substrate titanium silicide and selectively etching other titanium or titanium oxide than the silicide film by using the mixture gas containing titanium tetrachloride which is the material gas in CVD, and thus it is possible to solve the problem of the adhesion between the titanium film and the titanium nitride film. Therefore, even if a titanium nitride film having a large thickness is formed, it is possible to prevent the titanium nitride film from being cracked or peeled off. Therefore, according to the present invention, it is possible to form a thick, low resistance titanium nitride film with superior step coverage by CVD and to form the contact hole having a large aspect ratio. Further, since the possibility of crack and/or peel-off of the titanium nitride film is reduced, the manufacturing yield and the reliability of a product can be improved.

Further, since the present invention utilizes the high level selective etching characteristics of titanium tetrachloride as the process gas, it is possible to perform the manufacturing of semiconductor device within a short time by a continuous process without necessity of transferring a semiconductor substrate thereof. Therefore, it is possible to substantially reduce the number of manufacturing steps and to fabricate a semiconductor device with high producibility.

It is apparent that the present invention is not limited to the above embodiments, but may be modified and changed without departing from the scope and spirit of the invention.

What is claimed is:

1. A manufacturing method of semiconductor device, having a metal silicide film and a metal film formed in a first region and a second region of a semiconductor substrate of said semiconductor device, respectively, comprising selectively removing said metal film by simultaneously exposing said metal film and said metal silicide film to an etching gas containing halogen, wherein said metal film is a titanium film and said metal silicide film is a titanium silicide film, and wherein said etching gas is a gas containing titanium tetrachloride.

2. A manufacturing method of semiconductor device, comprising:

forming an insulating film on a semiconductor substrate;

forming an opening portion in said insulating film such that said semiconductor substrate is exposed;

depositing a metal film in said opening portion and on said insulating film;

forming a metal silicide film by a reaction of said metal film deposited in said opening portion and said semiconductor substrate; and selectively removing said metal film by simultaneously exposing said metal film and said metal silicide film to an etching gas containing halogen, wherein said metal film is a titanium film and said metal silicide film is a titanium suicide film, and wherein said etching gas is a gas containing titanium tetrachloride.

3. A manufacturing method of semiconductor device, comprising:

forming an insulating film on a semiconductor substrate;

forming an opening portion in said insulating film such that said semiconductor substrate is exposed;

depositing a titanium film in said opening portion and on said insulating film while forming a metal silicide film by a reaction of said titanium film deposited in said opening portion and said semiconductor substrate; and selectively removing said titanium film which is not reacted, by simultaneously exposing said titanium film and said metal silicide film to an etching gas containing halogen, wherein said titanium film is formed by chemical vapor deposition and a gas used for the chemical vapor deposition and said etching gas are a mixture gas containing titanium chloride.

4. A manufacturing method of semiconductor device, having a metal silicide film and a metal film formed in a first region and a second region of a semiconductor substrate of said semiconductor device, respectively, comprising selectively removing said metal film by simultaneously exposing said metal film and said metal silicide film to an etching gas containing halogen, wherein said metal silicide film and said metal film are formed by plasma CVD using the same gas as said etching gas as a material gas, and wherein said selectively removing said metal film is performed without generating plasma.

\* \* \* \* \*